United States Patent
Hou et al.

(10) Patent No.: US 7,297,632 B2
(45) Date of Patent: Nov. 20, 2007

(54) SCRATCH REDUCTION FOR CHEMICAL MECHANICAL POLISHING

(75) Inventors: Chuang-Ping Hou, YongKong (TW); Syun-Ming Jang, Hsin-Chu (TW); Ying-Ho Chen, Taipei (TW); Chu-Yun Fu, Taipei (TW); Tung-Ching Tseng, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/082,517

(22) Filed: Mar. 17, 2005

(65) Prior Publication Data
US 2006/0211250 A1 Sep. 21, 2006

(51) Int. Cl.
*H01L 21/311* (2006.01)

(52) U.S. Cl. ........................ 438/692; 438/691
(58) Field of Classification Search ............... 438/692, 438/693, 424, 691
See application file for complete search history.

(56) References Cited

U.S. PATENT DOCUMENTS

| 5,876,490 A * | 3/1999 | Ronay ........................... 106/3 |
| 6,098,638 A | 8/2000 | Miyashita et al. |
| 6,435,942 B1 | 8/2002 | Jin et al. |
| 6,435,945 B1 | 8/2002 | Somekh |
| 6,546,939 B1 | 4/2003 | Small |
| 6,979,650 B2 * | 12/2005 | Nakabayshi et al. ......... 438/692 |
| 7,029,509 B2 * | 4/2006 | Kim et al. ..................... 51/308 |
| 7,052,969 B1 * | 5/2006 | Sahota et al. ................ 438/424 |

* cited by examiner

*Primary Examiner*—Long Pham
(74) *Attorney, Agent, or Firm*—Haynes and Boone, LLP

(57) ABSTRACT

A method for forming a semiconductor device utilizing a chemical-mechanical polishing (CMP) process is provided. In one example, the method includes sequentially performing a first CMP process for removing a first portion of an oxide surface of a semiconductor device using a high selectivity slurry (HSS) and a first polish pad, interrupting the first CMP process, cleaning the semiconductor device and the first polish pad, and performing a second CMP process for removing a second portion of the oxide surface.

21 Claims, 2 Drawing Sheets

SCRATCH REDUCTION FOR CHEMICAL MECHANICAL POLISHING

BACKGROUND

The present disclosure relates generally to the manufacturing of semiconductor devices, and more particularly to a chemical-mechanical polishing (CMP) process utilized in semiconductor manufacturing.

The semiconductor integrated circuit (IC) industry has experienced rapid growth. Technological advances in IC materials and design have produced generations of ICs where each generation has smaller feature sizes and more complex circuits than those from the previous generation.

As IC technology has moved from 130 nanometers (nm) to 90 nm and beyond, planarizing techniques, such as chemical-mechanical polishing (CMP), are required to selectively remove high elevation features by a combination of mechanical polishing and chemical reaction. A typical system for CMP may have one or more platens, each for performing a separate CMP process. Generally, a wafer is mounted on a rotating carrier, and a CMP process is performed at each platen. Typically, an abrasive-containing aqueous slurry is provided during CMP to facilitate the process.

Several techniques have been used to advance the results of CMP. For example, oxide device reverse (ODR) is often used to remove a significant amount of oxide on large active areas. ODR requires more extra process steps and a mask (referred to as an ODR mask), and still could benefit from better thickness control. Another example is to use a high selectivity slurry (HSS) for a direct CMP procedure. In comparison with conventional silica-based slurries, the utilization of a HSS results in superior within-wafer (WIW) uniformity of trench oxide and active $Si_3N_4$ thickness, and superior within-die (WID) uniformity of trench oxide and active $Si_3N_4$ thickness. However, the utilization of HSS also results in increased scratch rates on the wafer, and therefore high defect rates.

What is desired is a new and improved system and method for enhancing the CMP process.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
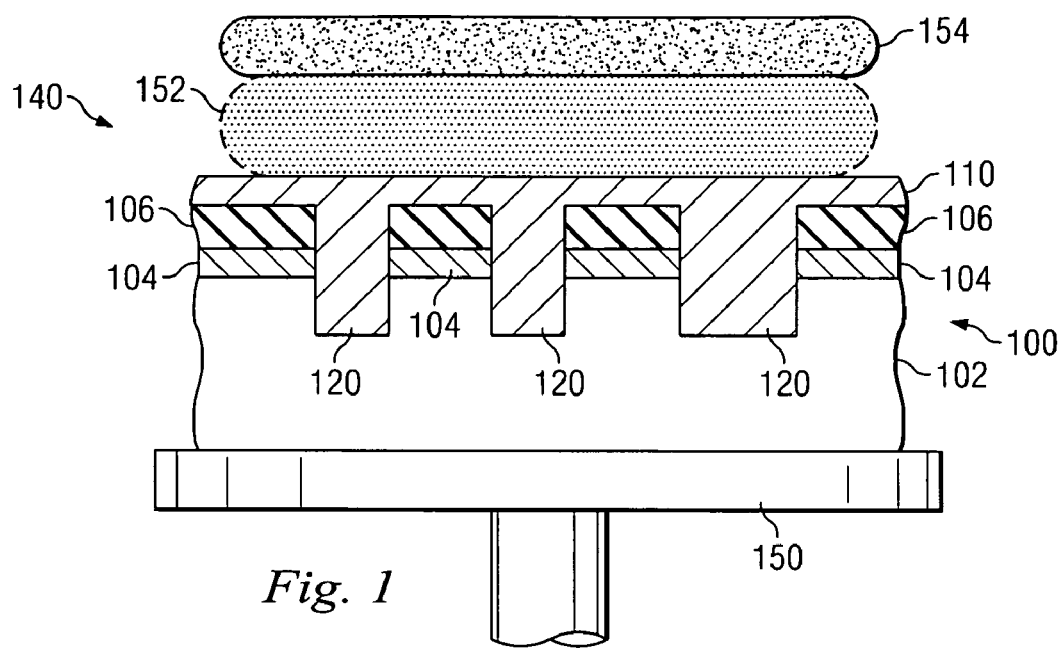
FIG. 1 is a system for implementing one or more embodiments of the present invention during fabrication of a semiconductor integrated circuit.

It is to be understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, a semiconductor device 100 includes a substrate 102. The substrate 102 may include one or more insulators, conductors, and/or semiconductor layers. For example, the substrate 102 may include an elementary semiconductor, such as crystal silicon, polycrystalline silicon, amorphous silicon, and/or germanium; a compound semiconductor, such as silicon carbide and/or gallium arsenic; an alloy semiconductor, such as SiGe, GaAsP, AlInAs, AlGaAs, and/or GaInP. Further, the substrate 102 may include a bulk semiconductor, such as bulk silicon, and such a bulk semiconductor may include an epi silicon layer. It may also or alternatively include a semiconductor-on-insulator substrate, such as a silicon-on-insulator (SOI) substrate, or a thin-film transistor (TFT) substrate. The substrate 102 may also or alternatively include a multiple silicon structure or a multilayer compound semiconductor structure.

An oxide layer 104, which may include silicon dioxide or any other suitable material, may be formed over the substrate 102 by thermal oxidation and/or other suitable methods. In one example, the thickness of the oxide layer 104 is between about 90 angstroms to about 130 angstroms, although other thicknesses are also contemplated by the present disclosure.

The semiconductor device 100 may further include a silicon nitride layer 106, which may be deposited over the oxide layer 104 by chemical vapor deposition (CVD) and/or any other suitable methods. The silicon nitride layer 106 may have a thickness of between about 600 angstroms to about 700 angstroms. It is noted that other thicknesses of the silicon nitride layer 106 are also contemplated by the present disclosure.

The semiconductor device 100 includes a dielectric layer 110, which may be used to fill trenches 120 in the substrate 102 and cover the silicon nitride layer 106. The dielectric layer 110 may be formed by CVD, plasma-enhanced CVD (PECVD), atomic layer deposition (ALD), physical vapor deposition (PVD), spin-on coating and/or other suitable methods. The dielectric layer 110 may be an inter-metal dielectric (IMD), and may include silicon oxide, polyimide, spin-on-glass (SOG), fluoride-doped silicate glass (FSG), Black Diamond® (a product of Applied Materials of Santa Clara, Calif.), Xerogel, Aerogel, amorphous fluorinated carbon, and/or other materials. In the present embodiment, the dielectric layer 110 may serve to isolate one or more shallow trenches 120.

In some embodiments, the dielectric layer 110 may have already received some type of planarization process, such as an oxide device reverse (ODR) process that removes portions of the layer not directly over the shallow trenches 120. The portions of the dielectric layer 110 may have been removed by dry etching or other etching methods, and some embodiments may utilize a direct CMP process. It is understood that other embodiments may not use a pre-planarization process.

The semiconductor device 100 is loaded onto a CMP system 140. The CMP system 140 includes one or more polishing heads 150 for receiving and securing the semiconductor device 100. The CMP system 140 also includes one or more slurries 152 and polishing pads 154. Generally, a slurry includes small, abrasive particles of specific sizes (typically about 10 nm to 100 nm in diameters) and shapes suspended in an aqueous solution. The abrasive particles may be as hard as the film that is to be polished. Acids or bases may be optionally added to the solution, depending on the material to be polished. The polishing rate may be affected by various slurry parameters, such as the chemical composition of the slurry solution, the concentration of the solid particles in the slurry, and the shape, size, and distribution of the slurry particles. An automatic slurry feeding system may be used to ensure the proper delivery of the slurry.

In the present embodiment, the slurry 152 utilizes a high selectivity slurry (HSS) including additives (e.g., surfactants) and abrasives (e.g., polishing agents). Typically, the weight of the additives are between about 1.8% and about 2.4%. In this example, the abrasives may include ceria ($CeO_2$), $ZrO_2$, $ThO_2$, $TiO_2$, $Fe_2O_3$ and/or other suitable materials. For the sake of example, ceria will be further discussed. Many of the most active polishing agents (abrasives) have many more "Lewis Acid" active sites (i.e., electron pair acceptors) in the abrasive's surface than do silica-based abrasives. The Lewis Acid active sites generate chemical bonding with the polished silicon oxide surface having alkali sites (i.e., electron pair donors). The same additives can passivate the polished stop layer (such as $Si_3N_4$, SiON, SiC, etc.) and achieve similar results (such as higher selectivity, better planarity and worse scratching performance). The chemical structure and concentration of additives can be chosen for selectivity, planarity and scratching performance.

It is contemplated that the slurry 152 may alternatively include ceria, $ZrO_2$, or any other suitable material suspended in an aqueous solution, such as alkaline or any other suitable solution, and may include any suitable concentration of additives known in the art. The slurry 152 may be procured from a commercial supplier, such as Cabot Corp., Rode Inc., or Hitachi Chem. Corp.

During shallow trench isolation (STI) CMP polishing with high-selectivity slurry (HSS), the lower area (e.g., trench oxide within the trench) is protected by the additives of HSS and the higher area (e.g., the upper surface) is polished by ceria chemical bonding and mechanical abrasion. Accordingly, the HSS having ceria abrasives and additives can achieve better planarity than the conventional silica-based slurry.

Compared to conventional silica-based slurries, ceria-based HSS exhibits better within-wafer (WIW) uniformity of trench oxide and active silicon nitride ($Si_3N_4$) thickness, and within-die (WID) uniformity of trench oxide and active silicon nitride ($Si_3N_4$) thickness (i.e., the WIW uniformity and WID uniformity are each smaller for the ceria-based HSS).

During STI-CMP with HSS (e.g., $CeO_2$-based abrasives), there is more absorbed additive on $Si_3N_4$ (silicon nitride) films than on $SiO_2$ (silicon oxide) film. Adding suitable surface additives that are easily adsorbed on a silicon nitride surface reduces the nitride polish rate without significantly reducing the oxide polish rate and can increase the polish rate selectivity of oxide to nitride. However, the mechanical abrasion of the trench oxide and silicon nitride surfaces causes scratches in the polished trench oxide surface and scratches in the polished silicon nitride surface. This is due, in some embodiments, to the hardness of the trench oxide, which is softer than that of the silicon nitride stop layer, and thus scratches are more easily generated in the polished trench oxide surface than in the polished silicon nitride surface.

In some embodiments, the present invention promotes the removal of the extra additives adsorbed on the surface to be polished, and hence the increased chemical bonding between the abrasives (e.g., $CeO_2$, $ZrO_2$, $ThO_2$, $TiO_2$ and $Fe_2O_3$) and the polished surface, e.g. silicon oxide, before the completion of the polishing. This helps to reduce the scratching of the polished surface and improve the device yield. A high-selectivity slurry consumption is reduced from about 20% to 40% using one or more embodiments of the present invention.

Figure 2:
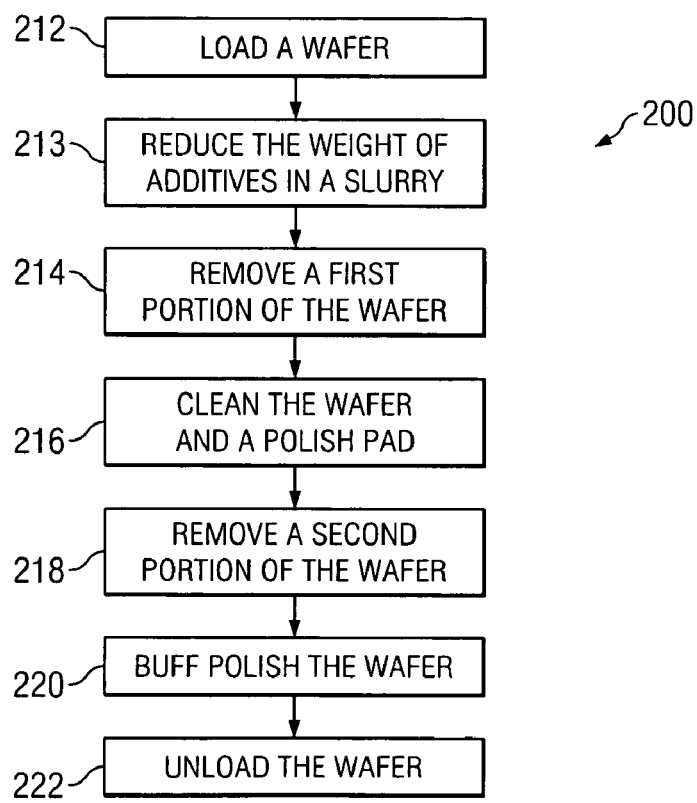
FIG. 2 is a flow chart of a CMP method according to one or more embodiments of the present invention.

Referring now to FIG. 2, a method 200 can be used for performing chemical mechanical polishing with HSS with a reduced amount of scratches or other defects. Execution begins at step 212, where a wafer (e.g., the semiconductor device 100 of FIG. 1) is loaded into a CMP system (e.g., the system 140). At step 213, the weight of the additives in the slurry 152 may be reduced to between about 0.4% and about 1.7% (as described above, the typical weight of additives is between about 1.8% and about 2.4%). Since additives tend to reduce the chemical bonding ability between the slurry 152 and the surface of the semiconductor device 100, such a reduction may decrease the scratch rate of the semiconductor device 100 during the CMP operation described below.

At step 214, a first portion of the dielectric material 110 removed. A polishing pressure of between about 2 pounds per inch (psi) and about 5 psi (or other suitable pressures) may be applied between the semiconductor device 100 and the polish pad 154, which may have a rotational speed of between approximately 50 rotations per minute (RPM) to approximately 100 RPM (although other speeds are also contemplated). The slurry 152 may be distributed onto the polish pad 154 at the speed of between about 150 milliliters per minute (ml/min) to about 350 ml/min (although other speeds are contemplated). Generally, step 214 is a timed polishing process that may last, for example, between about 30 seconds and 40 seconds.

In furtherance of the example, at step 216, the semiconductor device 100 and polish pad 154 are cleaned by a high pressure de-ionized water rinse or similar wet clean. In one example, the water pressure is between approximately 10 psi and 100 psi. Generally, step 216 is a timed cleaning process that may last between about 10 seconds and 60 seconds. The cleaning may remove HSS additives bonded on the surfaces of the semiconductor device 100 and on the polish pad 154, thereby reducing the scratch rate of the semiconductor device 100.

It is contemplated that step 216 may be performed while the semiconductor device 100 remains on the platen 150. Alternatively, the semiconductor device 100 may be removed from the platen 150 by a robot arm (not shown) and cleaned in a separate station. If applicable, the semiconductor device 100 is again loaded onto the platen 150 following step 216 or onto another platen.

At step 218, a second portion of the remaining dielectric material 110 is removed. Step 218 may be similar to step 214 in terms of polishing pressure, platen rotational speed, slurry distribution rate and/or duration. In one example, endpoint detection may be utilized to measure the reflectivity of the semiconductor device 100. As the dielectric material 110 is removed over time to expose an underlying portion of the silicon nitride layer 106, the reflectivity from the surface of the semiconductor device 100 will change accordingly. Upon the detection of such a change, the polishing step 218 may be terminated. Alternatively, a timer with a suitable duration may be utilized to monitor the completion of this polishing operation.

At step 220, buff polishing is performed on the semiconductor device 100, using a mixture of de-ionized water and the remaining HSS as the slurry. In one example, the mixture includes between about 20% and about 80% de-ionized water, and between about 20% and about 80% HSS. It is contemplated that the buff polishing may be performed at a polishing pressure of between approximately 2 psi and approximately 5 psi, while the platen 154 may be rotated at a speed of between about 50 RPM and about 100 RPM. In addition, the de-ionized water and HSS mixture may be distributed at a speed of between approximately 150 ml/min and 350 ml/min. Generally, step 120 is a timed polishing process that may last between about 10 seconds and 30 seconds. It is contemplated that additives remaining on the semiconductor device 100 may be removed during this step 220, thereby reducing the scratch rate of the finished semiconductor device.

At step 222, an optional wafer rinse and platen rinse may be performed during the unloading of the semiconductor device 100. Thereafter, additional steps are performed for forming a final semiconductor device. Since those additional steps are known in the art, they will not be further described herein.

It is contemplated that many variations may be utilized for performing the method 200. Specific examples of certain steps or combinations of steps are described in greater detail below.

De-Ionized Water High Pressure Rinse (DIW-HPR)

Figure 3A:
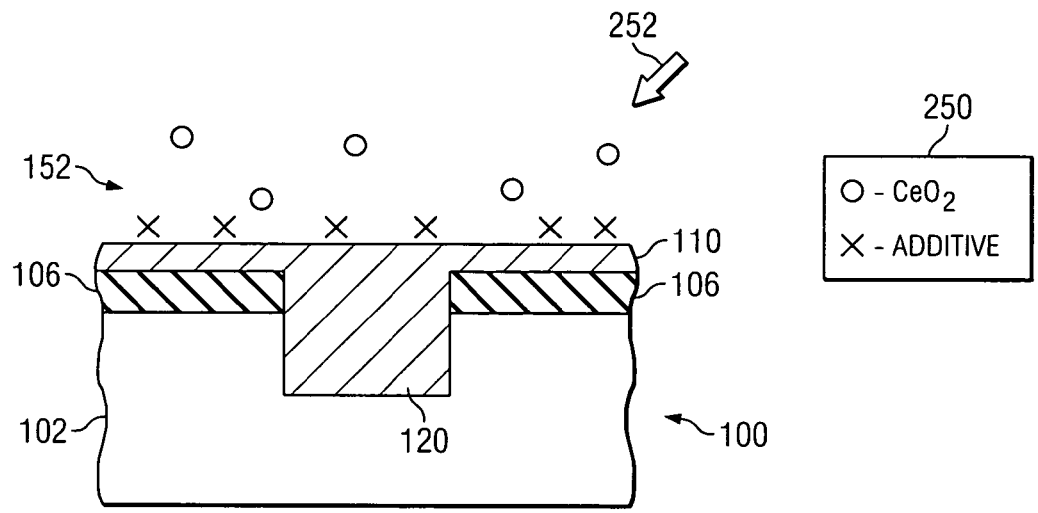
FIGS. 3a and 3b are cross sectional views of the semiconductor integrated circuit of FIG. 1 during processing according to embodiments of the present invention.
Figure 3B:
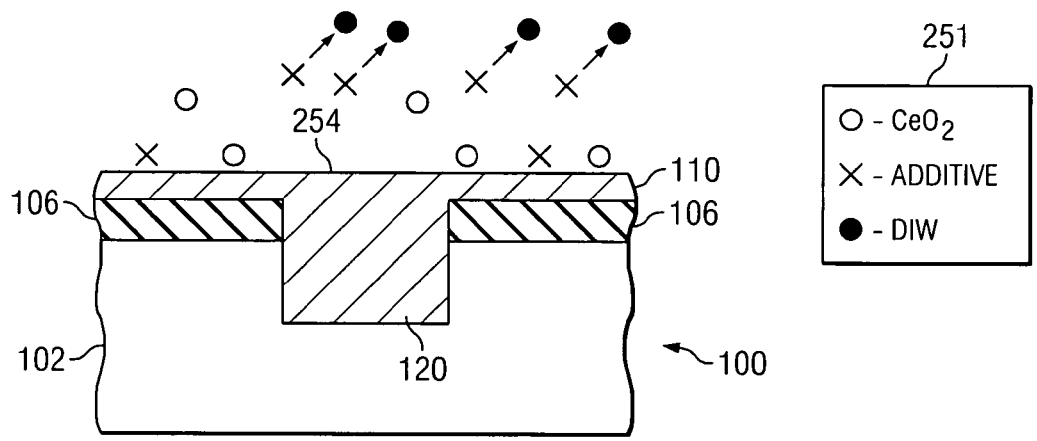

Referring now to FIGS. 3a and 3b, in some embodiments, the step 216 utilizes a deionized water (DIW) high pressure rinse (HPR). Legends 250 and 251 of FIGS. 3a and 3b, respectively, identify the abrasive (e.g., $CeO_2$), the additives, and DIW 252. In FIG. 3a, the DIW 252 is directed at high pressure onto the semiconductor device 100 and the polish pad 154 (FIG. 1). In FIG. 3b, the DIW 252 effectively removes at least some of the additives otherwise bonded to the partially polished surface 254 of the oxide layer 110 overlying STI 120 and nitride CMP stop layer 106. This "refreshes" the surface of oxide layer 110 before the abrasive-HSS polishing. One sample formula for the CMP process according to the present embodiment is:

Pre-HPR Clean->
Slurry Feed->
Polish Head Down->
First HSS Main Polish->
Slurry Feed Stop->
Polish Head Up->
DIW-HPR->
DIW Stop->
Slurry Feed->
Polish Head Down->
Second HSS Main Polish->
Slurry Feed Stop->
Polish Head Up->
Post-CMP DIW Clean->
Finish It is noted that by introducing a DIW-HPR between the steps of the HSS main-polish process, the rinse may also be used to clean the polished material surface 254 and the polish pad 154. The DIW-HPR removes the additives adsorbed on the polished wafer surface 254 and any surplus additives on the polish pad, thus improving the auto-stop polish phenomenon and reducing scratches.

About 40% to about 100% of the additives may be removed from the polished surface and the polish pad using the first method DIW-HPR of the present embodiment. This has been found to improve the scratch performance from about 30% to about 35%.

Extra De-Ionized Water Buff-Polish Step After HSS Polish

In accordance with another embodiment, a buff-polish can be used at step 220. The buff-polish increases the polish rate selectivity of silicon oxide to silicon nitride using a mixture of de-ionized water and the remaining HSS as the slurry. Also, the HSS polish time can be decreased and scratches may be reduced from about 40% to about 45%. One sample formula for the CMP process according to the present embodiment is:

Pre-HPR Clean->
Slurry Feed->
Polish Head Down->
HSS Main Polish->
Slurry Feed Stop->
DIW-Feed->
HSS DIW Buff-Polish->
DIW Feed Stop->
Polish Head Up->
Post-CMP DIW Clean->
Finish It is noted that in the present example, the extra DIW-feed removes the additives adsorbed on the polished wafer surface and dilutes the additive concentration in the remaining HSS. Thus, it would increase the silicon oxide polish rate, improve the auto-stop polish phenomenon, and reduce scratches. It is further noted that the HSS DIW Buff-Polish does not require a softer pad 154.

Scratch Reduction by Initially Decreasing Additive Content

In accordance with another embodiment, the additive content used for one or more of the HSS polishing steps 214, 218 can be reduced. This may result in scratches being reduced from about 30% to about 70%.

In experiments, from a baseline from about 1.8 to 2.4 wt % additive of the high-selectivity slurry (HSS) having a quantity of total defect/reviewed of 2174/233 ea with a total of 106 ea scratches includes a quantity of deep scratches/micro-scratches of 8/98 ea:

$1^{st}$ experiment: from about 1.7 to 1.1 wt % additive of the high-selectivity slurry; quantity of total defect reviewed: 1928/175 ea with a quantity of total scratches of 70 ea includes quantity of deep scratches/micro-scratches of 5/65; and $2^{nd}$ experiment: from about 1.0 to 0.4 wt % additive of the high-selectivity slurry; quantity of total defect reviewed: 1865/151 ea; with a quantity of total scratches of 31 ea includes a quantity of deep scratches/micro-scratches of 0/31.

Therefore, a reduction in the number of total scratches (sum of deep- and micro-scratches) of about 30% and 70%, respectively, is provided by decreasing the additive content from the baseline (from about 2.4 to 2.8 wt %) in the $1^{st}$ and $2^{nd}$ experiments.

Switch the Polished Wafer to Another Polish Pads

In accordance with another embodiment, the polished wafers may be switched to another polish pad during the HSS polishing to reduce the amount of additives and to reduce scratching by about 30% to about 35%. One sample formula for the CMP process according to the present embodiment is:

Pre-HPR Clean->
Slurry Feed->
Polish Head Down->
Main Polish Using A 1$^{st}$ Polish Pad->
Slurry Feed Stop->
Polish Head Up->
Post-CMP DIW Clean->

Switch the Polished Wafer from the 1$^{st}$ Polish Pad To A 2$^{nd}$ Polish Pad->
Slurry Feed->
Polish head down->
Main Polish Using A 2$^{nd}$ Polish Pad->
Post-CMP DIW Clean->
Finish Switching of the polish pads effectively reduces the amount of additive available on the polished wafer surface. This may result in a reduction of the scratches from about 30% to about 35%.

It is contemplated that many variations may be utilized for performing the method 200. In one example, step 214 may be performed for approximately the same duration as that of step 218. In a second example, step 214 may be terminated when approximately half of the dielectric material 110 has been removed. In a third example, step 216 may be repeated multiple times during the CMP operation. In a fourth example, following step 216, the partial semiconductor device is loaded onto a different platen. In a fifth example, the polish pad 154 may be replaced at least once by a clean polish pad during the CMP operation. In a sixth example, at step 220, instead of a mixture of HSS and de-ionized water, the slurry may include de-ionized water only. Therefore, a variety of modifications are contemplated by this disclosure.

Although only a few exemplary embodiments of this disclosure have been described in details above, those skilled in the art will readily appreciate that many modifications are possible in the exemplary embodiments without materially departing from the novel teachings and advantages of this disclosure. Also, features illustrated and discussed above with respect to some embodiments can be combined with features illustrated and discussed above with respect to other embodiments. Accordingly, all such modifications are intended to be included within the scope of this disclosure.

What is claimed is:

1. A method for forming a semiconductor device utilizing a chemical-mechanical polishing (CMP) process, sequentially comprising:
    performing a first CMP process for removing a first portion of an oxide surface of a semiconductor device using a high selectivity slurry (HSS) and a first polish pad;
    interrupting the first CMP process;
    cleaning the semiconductor device and the first polish pad; and
    performing a second CMP process for removing a second portion of the oxide surface.

2. The method of claim 1 wherein the semiconductor device comprises at least one shallow trench isolation structure and copper single/dual damascene structure.

3. The method of claim 2 wherein the oxide surface fills at least a part of the shallow trench isolation structure and copper forms the damascene structure.

4. The method of claim 1 wherein the HSS comprises ceria.

5. The method of claim 1 wherein the HSS comprises a substance selected from the group comprising $ZrO_2$, $ThO_2$, $TiO_2$ and $Fe_2O_3$.

6. The method of claim 1 wherein different polishing pads are used for the first and second CMP processes.

7. The method of claim 1 wherein different platens are used for the first and second CMP processes.

8. The method of claim 1 wherein the cleaning includes using a high pressure de-ionized water rinse of the oxide surface.

9. The method of claim 1 wherein the cleaning includes buffing the oxide surface.

10. A method for forming a semiconductor device utilizing a chemical-mechanical polishing (CMP) process, comprising:
    providing a semiconductor device;
    performing a CMP process on the semiconductor device with at least one high selectivity slurry (HSS); and
    buff polishing the semiconductor device with a slurry, wherein the slurry comprises de-ionized water and the remaining HSS from the CMP process.

11. The method of claim 10 wherein the semiconductor device comprises at least one shallow trench isolation structure.

12. The method of claim 10 wherein the at least one HSS comprises ceria.

13. The method of claim 10 wherein the at least one HSS comprises a substance selected from the group comprising $ZrO_2$, $ThO_2$, $TiO_2$ and $Fe_2O_3$.

14. A method for forming a semiconductor device utilizing a chemical-mechanical polishing (CMP) process, comprising:
    performing a first CMP process on a surface of the semiconductor device using a high selectivity slurry (HSS) having additives with a first weight of concentration;
    cleaning the surface of the semiconductor device; and
    performing a second CMP process on the surface of the semiconductor device using a high selectivity slurry (HSS) having additives with a second weight of concentration.

15. The method of claim 14 wherein the semiconductor device comprises at least one shallow trench isolation structure.

16. The method of claim 14 wherein the second weight of concentration is approximately 0.4%.

17. The method of claim 14 wherein the second weight of concentration is approximately 1.7%.

18. The method of claim 14 wherein the second weight of concentration is between about 0.4% and about 1.7%.

19. A method of reducing scratching of a surface of a semiconductor substrate using a polish head and a polish pad, the method comprising the steps of:
    providing a high-selectivity-slurry (HSS) including a first weight percentage of additives and a weight percentage of abrasives, wherein the first weight percentage of additives is from about 2.4 to 1.8 wt % and the second weight percentage of additives is from about 1.7 to 1.1 wt %;

reducing the first weight percentage of additives to a second weight percentage that is less than the first weight percentage by adding a deionized water buff-polish step during the CMP process;

performing a chemical-mechanical polishing (CMP) process to the surface using the HSS having the second weight percentage, whereby scratching of the surface is reduced; and interrupting the CMP process to clean the surface of the semiconductor substrate and the polishing pad before completing the CMP process.

20. A method of performing a chemical-mechanical polishing (CMP) process on a semiconductor device having at least one shallow trench structure, comprising:

selecting a high selectivity slurry (HSS) having additives with a weight of concentration ranging between about 0.4% and about 1.7%;

removing a first portion of a dielectric layer using the HSS and a polish pad;

cleaning the semiconductor device and the polish pad with high pressure de-ionized water;

removing a second portion of the dielectric layer using the HSS and the polish pad; and buff polishing the semiconductor device using a mixture of the remaining HSS and de-ionized water as a slurry.

21. The method of claim 20 further comprising replacing the polish pad with a new polish pad.

* * * * *